US009356088B2

United States Patent
Chen

(10) Patent No.: US 9,356,088 B2
(45) Date of Patent: May 31, 2016

(54) ACTIVE MATRIX ORGANIC LIGHT-EMITTING DIODE DISPLAY SUBSTRATE AND DISPLAY DEVICE

(71) Applicants: BOE TECHNOLOGY GROUP CO., LTD., Beijing (CN); ORDOS YUANSHENG OPTOELECTRONICS CO., LTD., Inner Mongolia (CN)

(72) Inventor: Junsheng Chen, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

(*) Notice: Subject to any disclaimer, the term of this patent is extended or adjusted under 35 U.S.C. 154(b) by 0 days.

(21) Appl. No.: 14/422,854

(22) PCT Filed: Apr. 30, 2014

(86) PCT No.: PCT/CN2014/076618
§ 371 (c)(1),
(2) Date: Feb. 20, 2015

(87) PCT Pub. No.: WO2015/096343
PCT Pub. Date: Jul. 2, 2015

(65) Prior Publication Data
US 2016/0071919 A1 Mar. 10, 2016

(30) Foreign Application Priority Data
Dec. 27, 2013 (CN) .......................... 2013 1 0741433

(51) Int. Cl.
*H01L 27/32* (2006.01)
*G09G 3/32* (2016.01)

(52) U.S. Cl.
CPC .......... *H01L 27/3279* (2013.01); *G09G 3/3225* (2013.01); *G09G 2300/0426* (2013.01); *G09G 2320/0233* (2013.01)

(58) Field of Classification Search
CPC .................................................. H01L 27/3279
See application file for complete search history.

(56) References Cited

U.S. PATENT DOCUMENTS

2006/0158095 A1* 7/2006 Imamura ............. H01L 27/3279
313/500

FOREIGN PATENT DOCUMENTS

| CN | 1430287 A | 7/2003 |
|---|---|---|
| CN | 1822738 A | 8/2006 |
| CN | 102916036 A | 2/2013 |
| CN | 102916037 A | 2/2013 |
| CN | 103745985 A | 4/2014 |

OTHER PUBLICATIONS

Chinese Office Action dated Dec. 12, 2014 corresponding to application No. 201310741433.8.
International Search Report dated Apr. 30, 2014 corresponding to application No. PCT/CN2014/076618.

* cited by examiner

*Primary Examiner* — Mamadou Diallo
(74) *Attorney, Agent, or Firm* — Nath, Goldberg & Meyer; Joshua B. Goldberg; Christopher Thomas

(57) ABSTRACT

The present invention provides an active matrix organic light-emitting diode display substrate and a display device. The active matrix organic light-emitting diode display substrate comprises a substrate and a plurality of pixel structures arranged in a matrix on the substrate, and further comprises a power signal structure for providing a power signal to each pixel structure, wherein the power signal structure comprises one layer of power signal electrode having a planar structure. By designing the power signal structure to include a power signal electrode having a planar structure, resistance of the power signal structure is reduced, and accordingly voltage drop of VDD decreases, thus the difference in driving voltage among organic light-emitting diodes is relatively small, and uniformity of display brightness of a display panel is ensured.

20 Claims, 5 Drawing Sheets

-- PRIOR ART --

-- PRIOR ART --

ACTIVE MATRIX ORGANIC LIGHT-EMITTING DIODE DISPLAY SUBSTRATE AND DISPLAY DEVICE

This is a National Phase Application filed under 35 U.S.C. 371 as a national stage of PCT/CN2014/076618, filed Apr. 30, 2014, an application claiming the benefit of Chinese Application No. 201310741433.8, filed Dec. 27, 2013, the content of each of which is hereby incorporated by reference in its entirety.

FIELD OF THE INVENTION

The present invention relates to the field of display technology, and particularly to an active matrix organic light-emitting diode display substrate and a display device comprising the active matrix organic light-emitting diode display substrate.

BACKGROUND OF THE INVENTION

Driving methods for organic light-emitting displays (OLEDs) may be categorized into two types, i.e., Passive Matrix (PM) and Active Matrix (AM). Compared with PM driving methods, AM driving methods have advantages of a large amount of display information, low power consumption, long lifespan, high image contrast ratio and the like. As shown in FIG. 1, an equivalent circuit of a pixel unit of an active matrix organic light-emitting display (AMOLED) in the prior art comprises: a switching tube M1, a driving tube M2, a storage capacitor C1 and an organic light-emitting diode D1. The switching tube M1 is turned on when its gate is enabled by a scanning signal Vscan(n), and a data signal Vdata is introduced. The driving tube M2 generally works in saturation region, and its gate-source voltage Vgs (i.e., the data signal Vdata) determines a current flowing therethrough, and thus a stable current is provided for the organic light-emitting diode D1. Here, VDD, as a supply voltage, provides energy required by the organic light-emitting diode D1 to emit light, that is to say, VDD affects luminous intensity of the organic light-emitting diode D1. The storage capacitor C1 is used to keep the gate voltage of the driving tube M2 stable during a period of one frame.

Of course, other threshold compensation circuit may be additionally provided to compensate threshold drift of the driving transistor M2, so that the current flowing through the driving tube M2 is not affected by the threshold voltage drift thereof.

FIG. 3 is a schematic diagram of a cross-sectional structure of a pixel of an AMOLED display panel, which comprises a substrate 1, a buffer layer 4 provided on the substrate 1, an active layer 6 provided on the buffer layer 4, a second insulation layer 5 provided on the active layer 6, a layer including a gate 9 and a signal wiring area 15 and provided on the second insulation layer 5, a third insulation layer 7 provided on the layer including the gate 9 and the signal wiring area 15, and a source 8, a drain 10 and a power signal connection line 22 provided on the third insulation layer 7. The power signal connection line 22 shown in the figure may be connected to the thin film transistor as required, the source 8 and the drain 10 of the thin film transistor are connected to the active layer 6 through via holes, 11 denotes a planarization layer, 12 denotes an anode of an organic light-emitting diode, which is connected to the drain 10 through a via hole, 14 denotes an organic light-emitting layer, and 13 denotes a pixel define layer.

As shown in FIG. 2, according to the current design, all pixels ("○" in FIG. 2 denotes omitted pixels 17) are connected together through VDD wires 16 in the periphery of and inside a display area 18. However, with an increase in resolution, every pixel 17 becomes smaller, and as a result, a relative large voltage drop may occur when the VDD wires 16 become very thin and long, which leads to different VDD voltages in different pixel units, and accordingly leads to difference in driving voltage among the organic light-emitting diodes D1, thus resulting in non-uniform display brightness of the panel in severe cases.

SUMMARY OF THE INVENTION

An object of the present invention is to provide an active matrix organic light-emitting diode display substrate which can achieve lower VDD voltage drop and more uniform display brightness of a panel, so as to solve the problem that the VDD wires in the prior art cause a relatively large voltage drop, and accordingly lead to difference in driving voltage among the OLED devices and non-uniform display brightness of the panel.

A technical solution used to solve the technical problem to be solved by the present invention is an active matrix organic light-emitting diode display substrate, which comprises a substrate and a plurality of pixel structures arranged in a matrix on the substrate, and further comprises a power signal structure for providing a power signal to each pixel structure, wherein the power signal structure comprises one layer of power signal electrode having a planar structure.

Since the power signal structure comprises a power signal electrode having a planar structure, resistance of the power signal structure is reduced, and accordingly voltage drop of VDD decreases, thus the difference in driving voltage among organic light-emitting diodes is relatively small, and uniformity of display brightness of a display panel is ensured.

Preferably, the power signal structure further comprises a power signal connection line, which is connected to the power signal electrode in parallel. The parallel connection between the power signal connection line and the power signal electrode further lowers the voltage drop of the supply voltage VDD.

Preferably, each of the plurality of pixel structures comprises a thin film transistor for driving an organic light-emitting diode, the power signal connection line and a gate of the thin film transistor are provided in the same layer, and the power signal electrode is provided on a surface of the substrate. By providing the power signal connection line and the gate of the thin film transistor in the same layer, manufacturing process thereof can be simplified, and the power signal connection line and the gate of the thin film transistor can be manufactured at one time. By providing the power signal electrode on the surface of the substrate, area of the power signal electrode can be increased as much as possible, so as to avoid too many openings.

Preferably, each of the plurality of pixel structures includes a thin film transistor for driving an organic light-emitting diode, the power signal connection line and a source and drain of the thin film transistor are provided in the same layer, and the power signal electrode is provided on a surface of the substrate. By providing the power signal connection line and the source and drain of the thin film transistor in the same layer, manufacturing process thereof can be simplified, and the power signal connection line and the source and drain of the thin film transistor can be manufactured at one time. By providing the power signal electrode on the surface of the substrate, area of the power signal electrode can be increased as much as possible, so as to avoid too many openings.

Preferably, projections of the power signal electrode and an active layer of the thin film transistor on the substrate are not overlapped with each other. In this way, the supply voltage signal is prevented from generating induced charges on the active layer and influencing control of the thin film transistor.

Preferably, the active matrix organic light-emitting diode display substrate further comprises a signal wiring area, and projections of the power signal electrode and the signal wiring area on the substrate are not overlapped with each other. In this way, bad influence on the signal wiring area caused by the supply voltage signal is avoided.

Preferably, the power signal connection line is connected to the power signal electrode through a via hole.

Preferably, an anode of the organic light-emitting diode is connected to the drain of the thin film transistor.

Another object of the present invention is to provides a display device comprising any one of the above active matrix organic light-emitting diode display substrates.

According to the active matrix organic light-emitting diode display substrate and the display device comprising the active matrix organic light-emitting diode display substrate of the present invention, since the power signal structure comprises a power signal electrode having a planar structure, resistance of the power signal structure is reduced, and accordingly voltage drop of VDD decreases, thus the difference in driving voltage among organic light-emitting diodes is relatively small, and uniformity of display brightness of a display panel is ensured.

DETAILED DESCRIPTION OF THE EMBODIMENTS

To enable those skilled in the art to better understand the technical solutions of the present invention, the present invention will be further described below in detail in conjunction with the accompanying drawings and the specific implementations.

Embodiment 1

Figure 4:
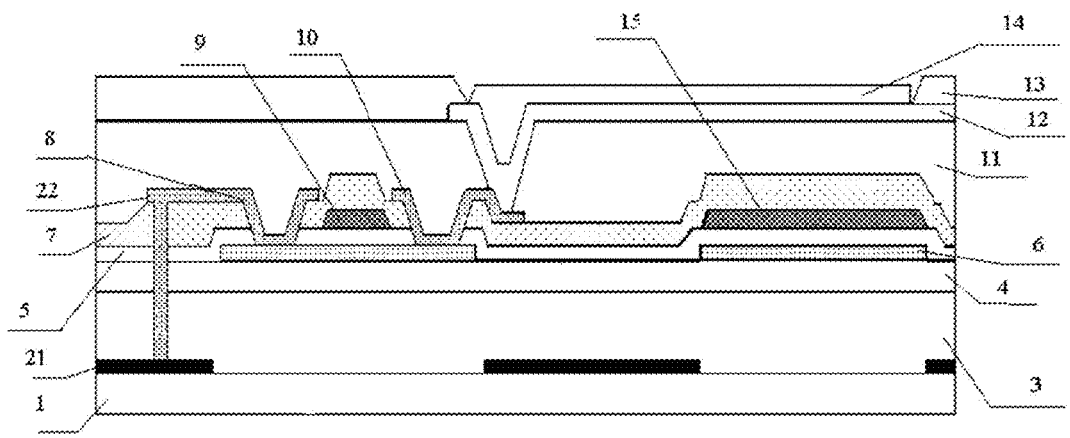
FIG. 4 is a sectional diagram schematically illustrating one pixel of an active matrix organic light-emitting diode display substrate, in which a power signal connection line and a source/drain are provided in the same layer and projections of a power signal electrode and an active layer of a thin film transistor on a substrate are not overlapped with each other, according to Embodiment 1 of the present invention.
Figure 5:
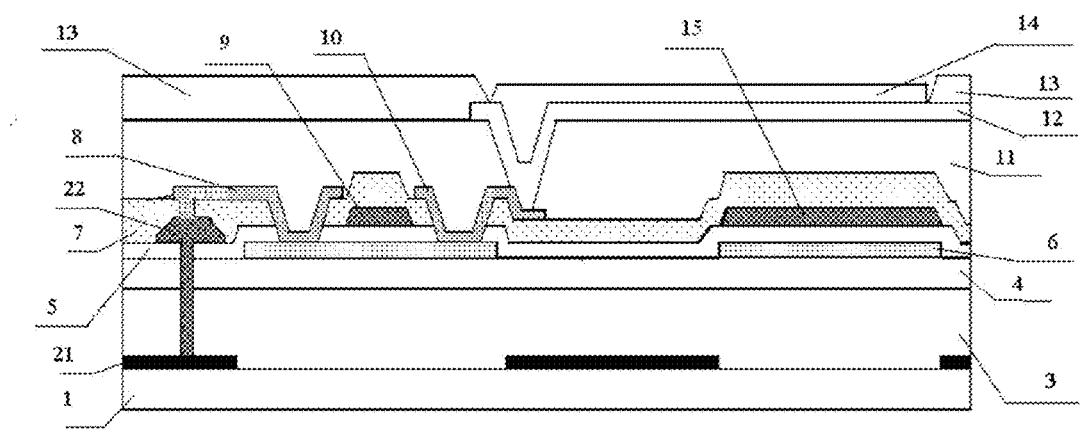
FIG. 5 is a sectional diagram schematically illustrating one pixel of another active matrix organic light-emitting diode display substrate, in which a power signal connection line and a gate are provided in the same layer and projections of a power signal electrode and a signal wiring area on a substrate are not overlapped with each other, according to Embodiment 1 of the present invention.

As shown in FIGS. 4 and 5, the present embodiment provides an active matrix organic light-emitting diode display substrate, which comprises a substrate 1 and a plurality of pixel structures arranged in a matrix on the substrate 1, and further comprises a power signal structure for providing a power signal for each pixel structure, wherein the power signal structure comprises one layer of power signal electrode 21 having a planar structure. Here, the "planar structure" means that the power signal electrode 21 is a separate layer in each pixel structure. It should be understood that when a thin film transistor into which a power signal is required to be input and the planar power signal electrode 21 are provided in different layers, a via hole may be provided above the power signal electrode 21 according to specific situations and the thin film transistor into which power signal is required to be input and the power signal electrode 21 are connected through the via hole.

Figure 1:
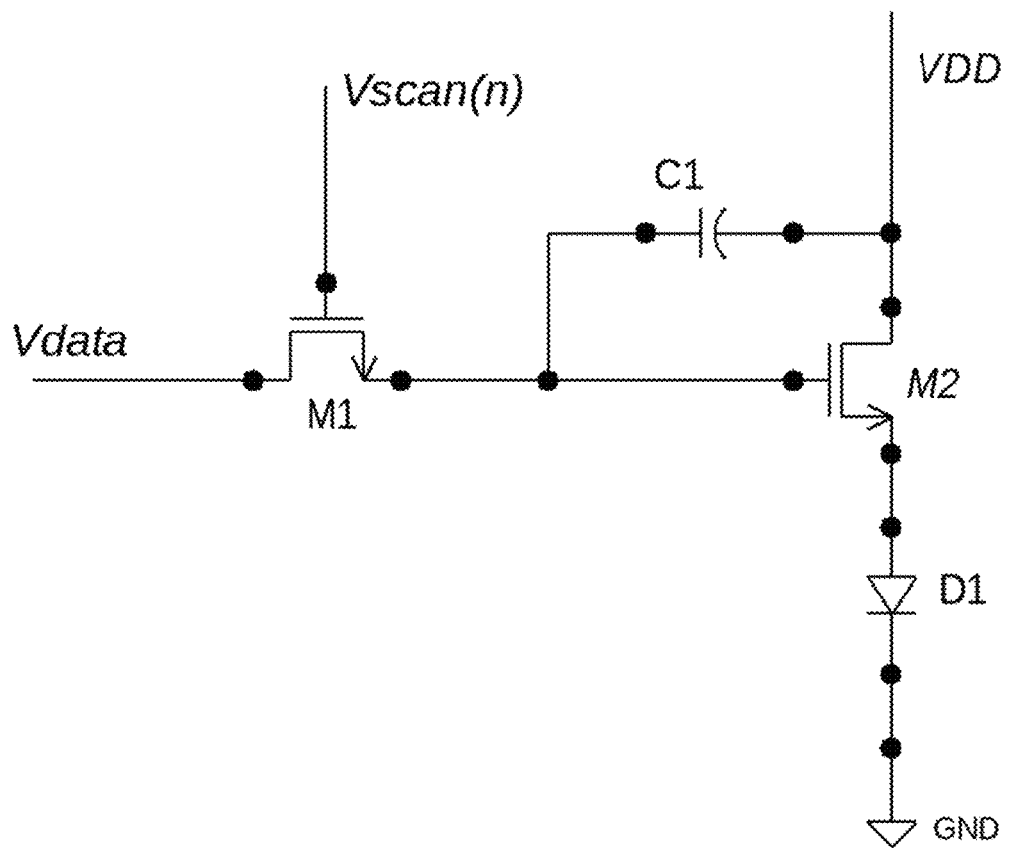
FIG. 1 is a schematic diagram illustrating an equivalent circuit of a pixel unit of an active matrix organic light-emitting diode display substrate in the prior art.
Figure 2:
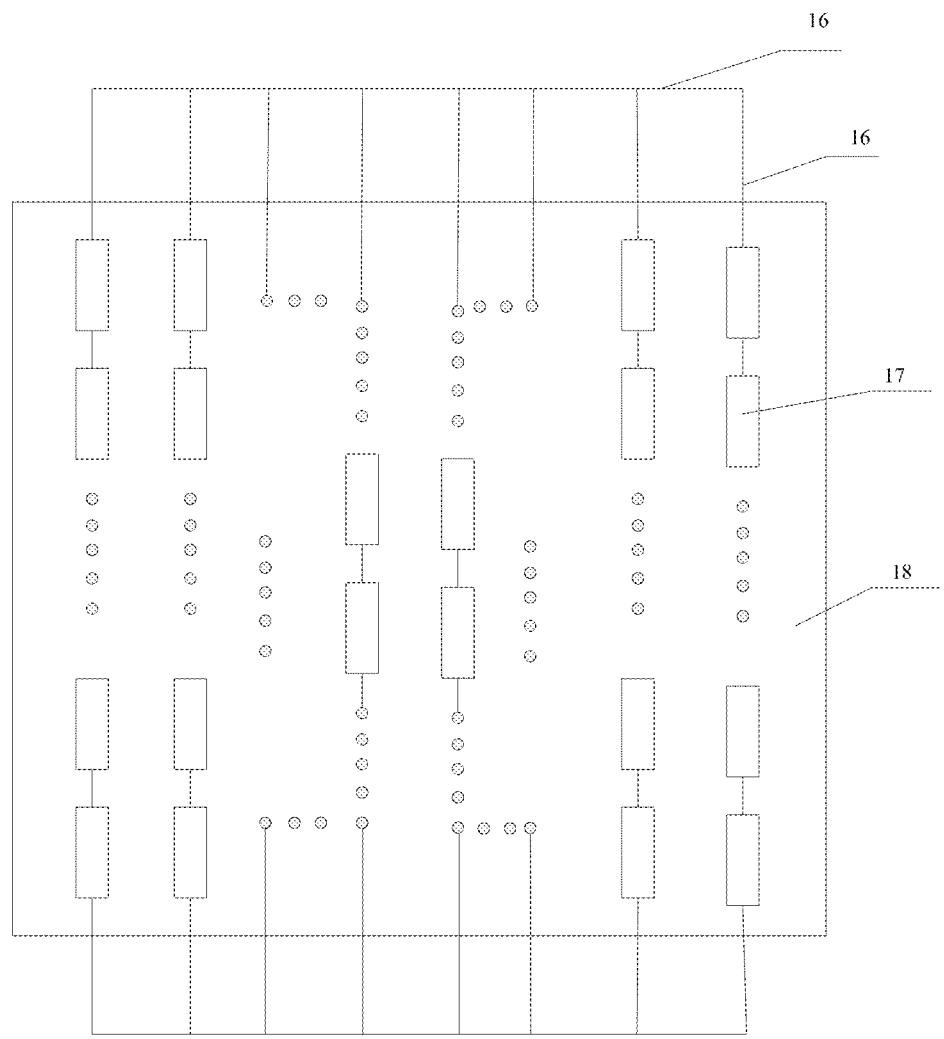
FIG. 2 is a schematic diagram illustrating VDD wires of an active matrix organic light-emitting diode display substrate in the prior art.
Figure 3:
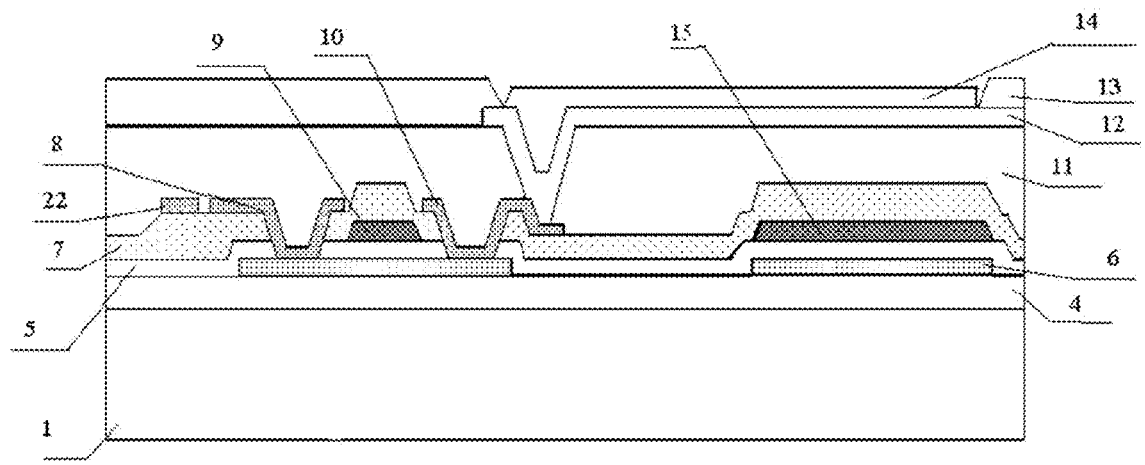
FIG. 3 is a sectional diagram schematically illustrating one pixel of an active matrix organic light-emitting diode display substrate in the prior art.

Since the power signal structure comprises one layer of power signal electrode 21 having a planar structure, compared to the linear structure (e.g., wires 16 in the periphery of pixels in FIG. 2 and power signal connection line 22 in a pixel in FIG. 3) in the prior art, resistance of the power signal structure is reduced, accordingly voltage drop of VDD decreases, thus the difference in driving voltage among organic light-emitting diodes is relatively small, and uniformity of display brightness of a display panel is ensured.

Preferably, the power signal structure further comprises a power signal connection line 22, which is connected to the power signal electrode 21 in parallel. The parallel connection between the power signal connection line 22 and the power signal electrode 21 further lowers the voltage drop of the supply voltage.

Preferably, the power signal electrode 21 is connected to the power signal connection line 22 through a via hole, and transfers power signal to other functional layers of the pixel structure, for example, to a source 8.

It should be understood that top-gate type TFTs are taken as examples in FIGS. 4 and 5, but the present embodiment may also adopt bottom-gate type TFTs.

In addition, the active matrix organic light-emitting diode display substrate in the present embodiment may be of top emission type or bottom emission type. However, since the power signal electrode 21 is generally made of metal, and may thus influence light transmittance, the active matrix organic light-emitting diode display substrate in the present embodiment is preferably of top emission type. Particularly, if the power signal electrode 21 is made of a reflective metal, a separate reflective layer can be omitted.

Figure 6:
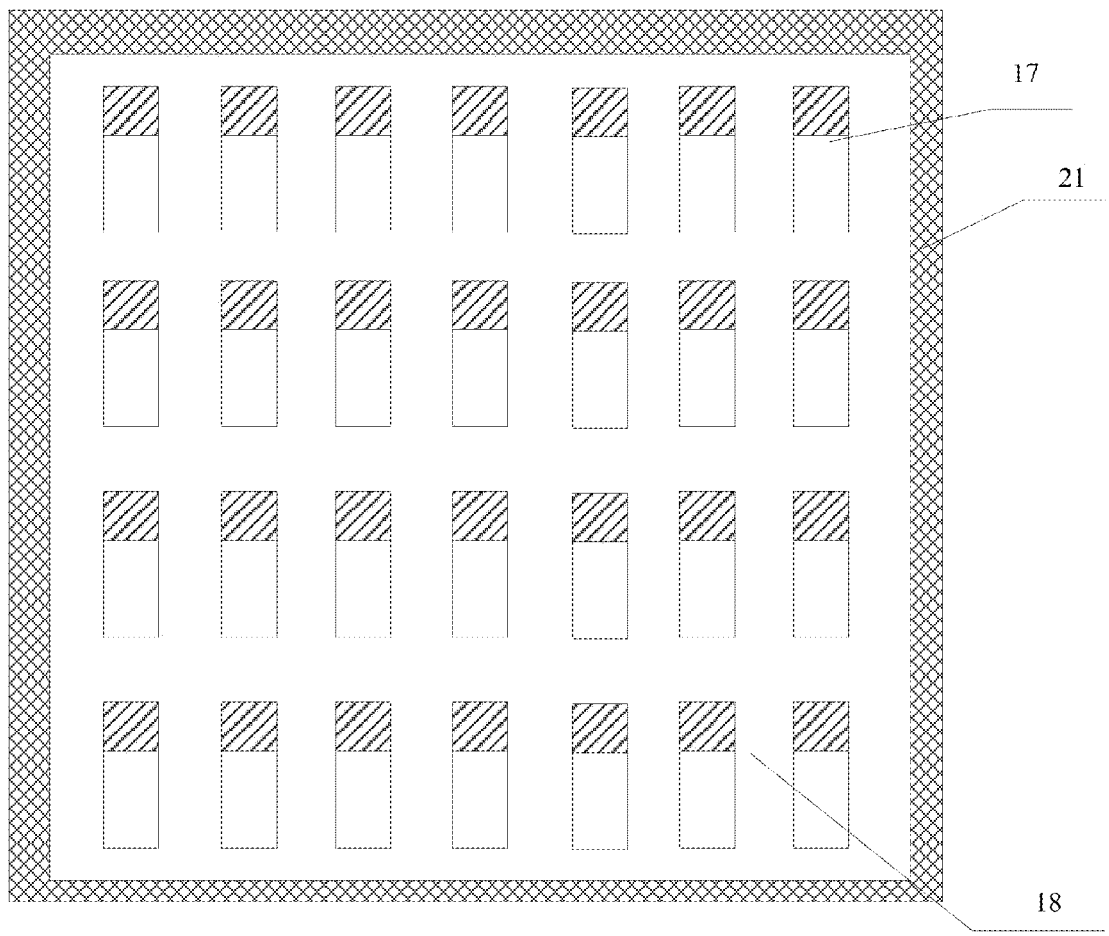
FIG. 6 is a top view schematically illustrating an active matrix organic light-emitting diode display substrate according to Embodiment 1 of the present invention.

As shown in FIGS. 4 to 6, the power signal electrode 21 is provided on the substrate 1, a first insulation layer 3 is provided between the power signal electrode 21 and a buffer layer 4, and it should be understood that the power signal electrode 21 may be provided at other position of the active matrix organic light-emitting diode display substrate. In the present embodiment, the power signal electrode 21 is directly provided on a surface of the substrate 1, thus it is convenient to manufacture, and compared to a case in which the power signal electrode 21 is formed in a middle position of the active matrix organic light-emitting diode display substrate, fewer openings are required when the power signal electrode 21 is directly provided on the surface of the substrate 1. In this case, a relatively large conductive area can be easily formed, which facilitates further reducing resistance.

Preferably, the power signal connection line 22 of the power signal structure may be provided at any position of the active matrix organic light-emitting diode display substrate as required. It should be understood that, in order to economize on procedure and shorten process in manufacturing, the power signal connection line 22 may be provided in the same layer as other metal layer of the active matrix organic light-emitting diode display substrate. Preferably, as shown in FIG. 5, the power signal connection line 22 is provided in the same layer as a gate.

Each pixel structure comprises a source 8 and a drain 10, and preferably, the power signal connection line 22 is connected with the source 8. It should be understood that since active matrix organic light-emitting diode display substrates have different types of structures, and may also have different internal wiring, the power signal connection line 22 may be connected to other line or structure as required.

As shown in FIG. 4, preferably, the power signal connection line 22 is provided in the same layer as the source/drain, and is connected to the source 8. The power signal electrode 21 is provided on the surface of the substrate 1 and is connected to the power signal connection line 22 through a via hole.

Since the power signal electrode 21 has a planar structure, that is, the power signal electrode 21 may cover the whole substrate 1. As shown in FIG. 6, the power signal electrode 21 is laid all over the area below the display area 18 (only edge portions of the power signal electrode 21 can be seen due to the blocking of the display area 18), and therefore, no wires (for example, wires 16 in FIG. 2) need to be provided among the pixels 17.

Since the power signal electrode 21 has a large conductive area, and accordingly has a relatively small resistance, the resistance of the power signal structure can be further reduced, which facilitates decreasing voltage drop of VDD.

Preferably, when the first insulation layer 3 is relatively thin, in order to prevent a supply voltage signal from influencing control of the thin film transistor, for example, from generating induced charges on an active layer 6 and thus influencing the control of the thin film transistor by the gate 9, it is required that projections of the power signal electrode 21 and the active layer of the thin film transistor on the substrate are not overlapped with each other.

Preferably, the active matrix organic light-emitting diode display substrate further comprises an anode 21 of an organic light-emitting diode connected to the drain 10 of the thin film transistor and a signal wiring area 15 provided in the same layer as the gate of the thin film transistor. It should be understood that, according to different applications of the active matrix organic light-emitting diode display substrate, an actual signal applied to the signal wiring area 15 in each pixel structure may be a gate line signal, a data line signal, or the like.

Preferably, in order to avoid influence on signals in the signal wiring area 15, projections of the power signal electrode 21 and the signal wiring area 15 on the substrate are not overlapped with each other.

It can be understood that, manufacturing methods of the functional layers of the above active matrix organic light-emitting diode display substrate belong to prior art, and are not elaborated one by one herein.

Embodiment 2

The present embodiment provides a display device, which comprises any one of the active matrix organic light-emitting diode display substrates described above.

It can be understood that, the above implementations are merely exemplary implementations for explaining the principle of the present invention, but the present invention is not limited thereto. For those skilled in the art, various variations and improvements may be made without departing from the spirit and essence of the present invention, and these variations and improvements are also deemed as the protection scope of the present invention.

The invention claimed is:

1. An active matrix organic light-emitting diode display substrate, comprising a substrate and a plurality of pixel structures arranged in a matrix on the substrate, wherein the active matrix organic light-emitting diode display substrate further comprises a power signal structure for providing a power signal for each of the plurality of pixel structures, and the power signal structure consists of one layer of power signal electrode having a planar structure.

2. The active matrix organic light-emitting diode display substrate according to claim 1, wherein the power signal electrode is provided on a surface of the substrate.

3. The active matrix organic light-emitting diode display substrate according to claim 1, further comprising a power signal connection line, which is connected to the power signal electrode in parallel.

4. The active matrix organic light-emitting diode display substrate according to claim 3, wherein each of the plurality of pixel structures comprises a thin film transistor for driving an organic light-emitting diode, and the power signal connection line and a gate of the thin film transistor are provided in the same layer, or the power signal connection line and a source and drain of the thin film transistor are provided in the same layer.

5. The active matrix organic light-emitting diode display substrate according to claim 4, wherein projections of the power signal electrode and an active layer of the thin film transistor on the substrate are not overlapped with each other.

6. The active matrix organic light-emitting diode display substrate according to claim 4, further comprising a signal wiring area, wherein projections of the power signal electrode and the signal wiring area on the substrate are not overlapped with each other.

7. The active matrix organic light-emitting diode display substrate according to claim 4, wherein the power signal connection line is connected to the power signal electrode through a via hole.

8. The active matrix organic light-emitting diode display substrate according to claim 4, wherein an anode of the organic light-emitting diode is connected to the drain of the thin film transistor.

9. The active matrix organic light-emitting diode display substrate according to claim 2, further comprising a power signal connection line, which is connected to the power signal electrode in parallel.

10. The active matrix organic light-emitting diode display substrate according to claim 9, wherein each of the plurality of pixel structures comprises a thin film transistor for driving an organic light-emitting diode, and the power signal connection line and a gate of the thin film transistor are provided in the same layer, or the power signal connection line and a source and drain of the thin film transistor are provided in the same layer.

11. The active matrix organic light-emitting diode display substrate according to claim 10, wherein projections of the power signal electrode and an active layer of the thin film transistor on the substrate are not overlapped with each other.

12. The active matrix organic light-emitting diode display substrate according to claim 10, further comprising a signal wiring area, wherein projections of the power signal electrode and the signal wiring area on the substrate are not overlapped with each other.

13. The active matrix organic light-emitting diode display substrate according to claim 10, wherein the power signal connection line is connected to the power signal electrode through a via hole.

14. The active matrix organic light-emitting diode display substrate according to claim 10, wherein an anode of the organic light-emitting diode is connected to the drain of the thin film transistor.

15. A display device, comprising an active matrix organic light-emitting diode display substrate, which comprises a substrate and a plurality of pixel structures arranged in a matrix on the substrate, wherein the active matrix organic light-emitting diode display substrate further comprises a power signal structure for providing a power signal for each of the plurality of pixel structures, and the power signal structure consists of one layer of power signal electrode having a planar structure.

16. The display device according to claim 15, wherein the power signal electrode is provided on a surface of the substrate.

17. The display device according to claim 16, further comprising a power signal connection line, which is connected to the power signal electrode in parallel.

18. The display device according to claim 17, wherein each of the plurality of pixel structures comprises a thin film transistor for driving an organic light-emitting diode, and the power signal connection line and a gate of the thin film transistor are provided in the same layer, or the power signal connection line and a source and drain of the thin film transistor are provided in the same layer.

19. The display device according to claim 18, wherein projections of the power signal electrode and an active layer of the thin film transistor on the substrate are not overlapped with each other.

20. The display device according to claim 18, further comprising a signal wiring area, wherein projections of the power signal electrode and the signal wiring area on the substrate are not overlapped with each other.

* * * * *